United States Patent
Busch et al.

(10) Patent No.: US 8,871,103 B2
(45) Date of Patent: Oct. 28, 2014

(54) PROCESS OF PLANARIZING A WAFER WITH A LARGE STEP HEIGHT AND/OR SURFACE AREA FEATURES

(71) Applicant: Nanya Technology Corp., Tao-Yuan Hsien (TW)

(72) Inventors: Brett Busch, Boise, ID (US); Gowri Damarla, Boise, ID (US); Anurag Jindal, Boise, ID (US); Chia-Yen Ho, New Taipei (TW); Thy Tran, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 14/049,232

(22) Filed: Oct. 9, 2013

(65) Prior Publication Data

US 2014/0038414 A1    Feb. 6, 2014

Related U.S. Application Data

(62) Division of application No. 13/080,676, filed on Apr. 6, 2011, now Pat. No. 8,580,690.

(51) Int. Cl.
*H01L 21/306* (2006.01)
*H01L 21/321* (2006.01)
*H01L 27/108* (2006.01)

(52) U.S. Cl.
CPC ...... *H01L 21/30625* (2013.01); *H01L 21/3212* (2013.01); *H01L 27/10894* (2013.01)
USPC .................. 216/38; 216/53; 438/692

(58) Field of Classification Search
None
See application file for complete search history.

(56) References Cited

U.S. PATENT DOCUMENTS

| | | | |
|---|---|---|---|
| 4,671,851 A * | 6/1987 | Beyer et al. | 438/426 |
| 5,272,117 A | 12/1993 | Roth | |
| 5,290,396 A | 3/1994 | Schoenborn | |
| 5,314,843 A * | 5/1994 | Yu et al. | 438/692 |
| 5,362,669 A | 11/1994 | Boyd | |
| 5,516,625 A | 5/1996 | McNamara | |
| 5,560,802 A | 10/1996 | Chisholm | |
| 5,688,720 A * | 11/1997 | Hayashi | 438/633 |
| 5,789,320 A | 8/1998 | Andricacos | |
| 5,904,558 A | 5/1999 | Suzuki | |
| 5,948,205 A * | 9/1999 | Kodera et al. | 156/345.13 |
| 6,117,740 A | 9/2000 | Lin | |
| 6,239,020 B1 * | 5/2001 | Lou | 438/624 |

(Continued)

FOREIGN PATENT DOCUMENTS

| TW | 200401018 | 1/2004 |
|---|---|---|
| TW | 200743151 | 11/2007 |

*Primary Examiner* — Allan Olsen
(74) *Attorney, Agent, or Firm* — Winston Hsu; Scott Margo

(57) ABSTRACT

A blanket stop layer is conformally formed on a layer with a large step height. A first chemical mechanical polishing process is performed to remove the blanket stop layer atop the layer in the raised region. A second chemical mechanical polishing process is performed to planarize the wafer using the blanket stop layer as a stop layer when the layer is lower than or at a same level as the blanket stop layer or using the layer as a stop layer when the blanket stop layer is lower than or at a same level as the layer, or a selective dry etch is performed to remove the layer in the raised region. Thus, the layer in the raised region can be easily removed without occurrence of dishing in the non-raised region which is protected by the blanket stop layer.

2 Claims, 8 Drawing Sheets

(56) References Cited

U.S. PATENT DOCUMENTS

| | | |
|---|---|---|
| 6,261,157 B1 | 7/2001 | Bajaj |
| 6,271,123 B1 * | 8/2001 | Jang et al. ............ 438/633 |
| 6,331,727 B1 | 12/2001 | Nakajima |
| 6,335,287 B1 * | 1/2002 | Hwang et al. ......... 438/692 |
| 6,358,827 B1 | 3/2002 | Chen |
| 6,399,502 B1 | 6/2002 | Hernandez |
| 6,589,863 B1 | 7/2003 | Usami |
| 7,763,540 B2 | 7/2010 | Johnson |
| 2002/0022333 A1 | 2/2002 | Morand |
| 2002/0050648 A1 | 5/2002 | Kishida |
| 2002/0102835 A1 | 8/2002 | Stucchi |
| 2003/0017705 A1 | 1/2003 | Rooyackers |
| 2003/0129838 A1 | 7/2003 | Cadien |
| 2003/0143851 A1 | 7/2003 | Cadien |
| 2003/0205810 A1 | 11/2003 | Usami |
| 2006/0216937 A1 | 9/2006 | Dunton |
| 2006/0234491 A1 | 10/2006 | Hu |
| 2007/0111433 A1 | 5/2007 | Hirasawa |
| 2008/0032606 A1 | 2/2008 | Liu |
| 2008/0254615 A1 | 10/2008 | Dunton |
| 2010/0075501 A1 | 3/2010 | Abe |
| 2010/0118448 A1 | 5/2010 | Yasui |
| 2010/0163787 A1 | 7/2010 | Tanaka |

\* cited by examiner

PROCESS OF PLANARIZING A WAFER WITH A LARGE STEP HEIGHT AND/OR SURFACE AREA FEATURES

CROSS REFERENCE TO RELATED APPLICATIONS

This application is a divisional application of U.S. patent application Ser. No. 13/080,676 filed Apr. 6, 2011, which is herein incorporated by reference in its entirety.

BACKGROUND OF THE INVENTION

1. Field of the Invention

The present invention relates to a method of fabricating a semiconductor device, and particularly to a process of planarizing a wafer.

2. Description of the Prior Art

There are several different types of semiconductor devices, for example memory devices, electronic signal processors, devices for capturing or acquiring images, etc. In a semiconductor process, it is common to carry out a planarization on a rough semiconductor surface to enhance precision of pattern transfer. The planarization is usually accomplished by a chemical mechanical polishing (CMP) method. The theory of CMP is to place a semiconductor wafer on a polishing station, then add a slurry to use chemical reaction and mechanical polishing to planarize a rough semiconductor surface. Dry etch is also a common process to chemically remove layers from the surface of a wafer during manufacturing. During etching, part of the wafer is protected from the etchant by a mask which resists etching. The mask may be a patterned photoresist or a durable mask, such as silicon nitride.

For more specific examples, such as 45 nm DRAM and smaller, the fabrication of container capacitor module starts with a standard oxide layer, the oxide is subsequently removed from the main array and any other areas where capacitors will be formed, and then those areas are filled with polysilicon. Deep contacts are formed in such polysilicon. The conductive stack must be later removed (or not placed) in the DRAM periphery logic areas. This process flow requires a challenging CMP process for large step (1.5-2.0 μm) replanarization of the polysilicon layer. In such CMP process, dishing phenomenon tends to occur in the array region, which may be illustrated by the memory cell array region 203 including polysilicon surrounded by the peripheral logic region 204 including oxide in FIG. 1.

Therefore, there is a need for a novel process of planarizing a wafer, during which there is a large step height and/or surface area between a memory cell array region and a peripheral region, without occurrence of dishing phenomenon.

SUMMARY OF THE INVENTION

One object of the present invention is to provide a novel process of planarizing a wafer which minimizes or eliminates dishing when height difference (step height) between a first region and a second region is high or the first region surface area is very large relative to the second region. This is accomplished by using a top blanket stop layer along with a conventional bottom stop layer.

In one aspect, the novel process of planarizing a wafer according to the present invention includes steps as follows. The wafer is provided. The wafer includes a first layer and a second layer and defined into a first region and a second region. The second layer is vertically on the first layer. The second region laterally abuts the first region. The wafer is etched to remove the second layer in the first region. A third layer is conformally formed to cover the first layer and the second layer. A blanket stop layer is conformally formed on the third layer. This blanket stop layer from the top helps in eliminating dishing in the first region during planarizing process. A first CMP process is performed to remove the blanket stop layer atop the third layer in the second region taking advantage of very high step height difference between the first and the second regions. In one embodiment, a second CMP process is performed to planarize the wafer using the blanket stop layer in the first region or the second layer in the second region or both the first and the second regions as stop layer(s) depending on the second and the third layer thicknesses relative to each other. A third CMP process may be performed to planarize the wafer to remove the remaining blanket stop layer and the third layer in the second region based on the requirement.

Alternatively, after a second CMP process is performed to planarize the wafer using the blanket stop layer or the second layer as a stop layer, the remaining blanket stop layer is stripped. A third CMP process may be further performed to planarize the wafer.

Alternatively, after finishing the blanket stop layer polish, a selective dry etch can be performed to remove the third layer in the second region followed by CMP to remove the blanket stop layer selective to the third layer in the first region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
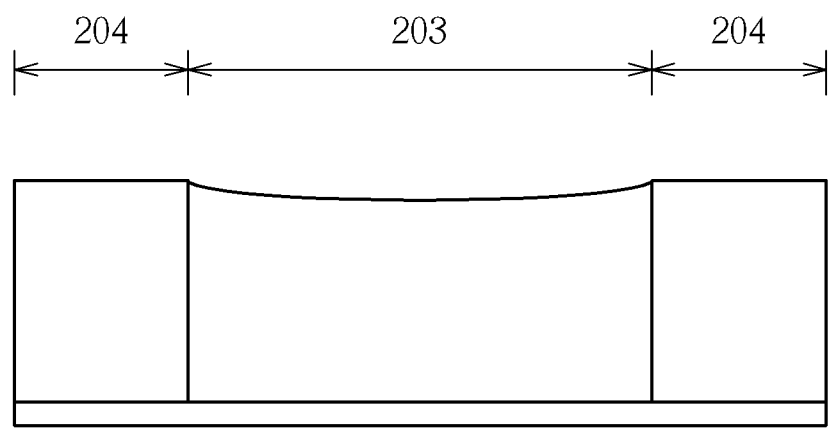
FIG. 1 shows a dishing phenomenon by a conventional technology.
Figure 2:
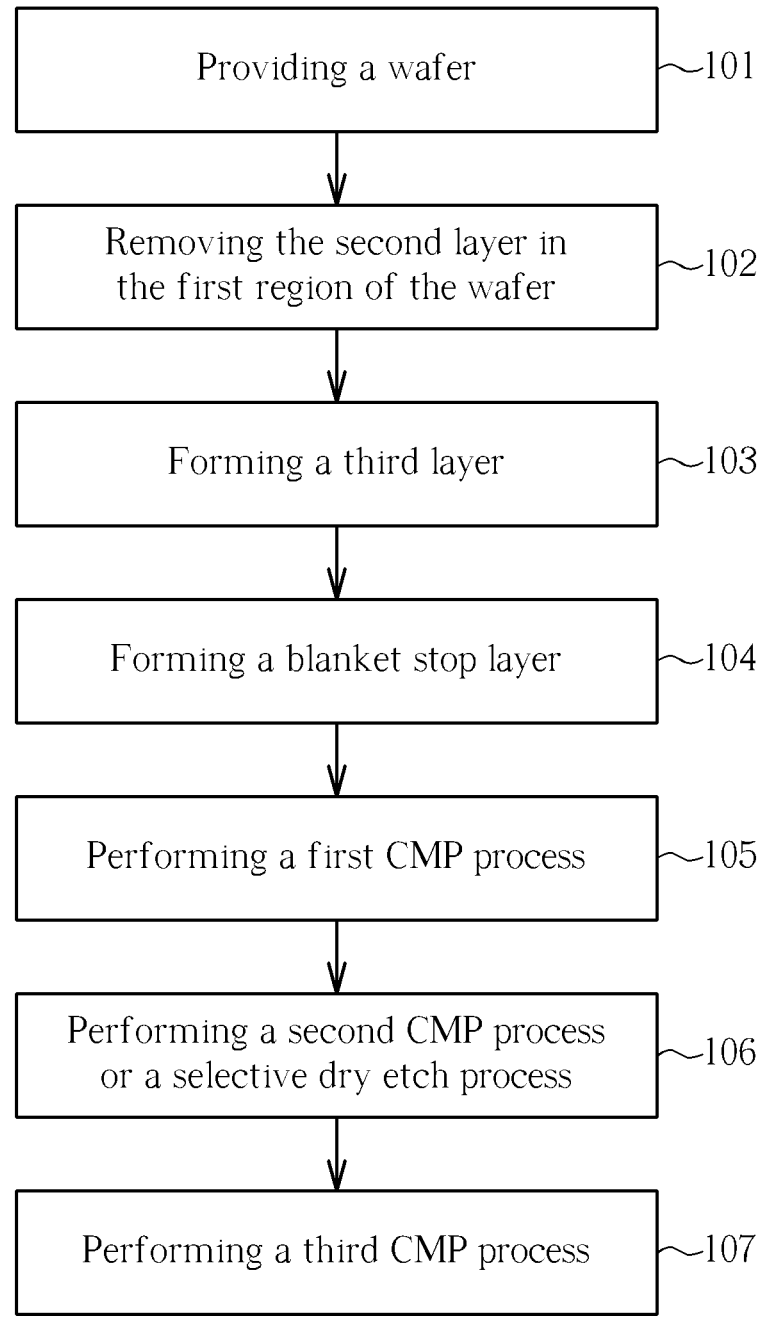
FIG. 2 is a flow chart showing an embodiment according to the present invention.
Figure 3:
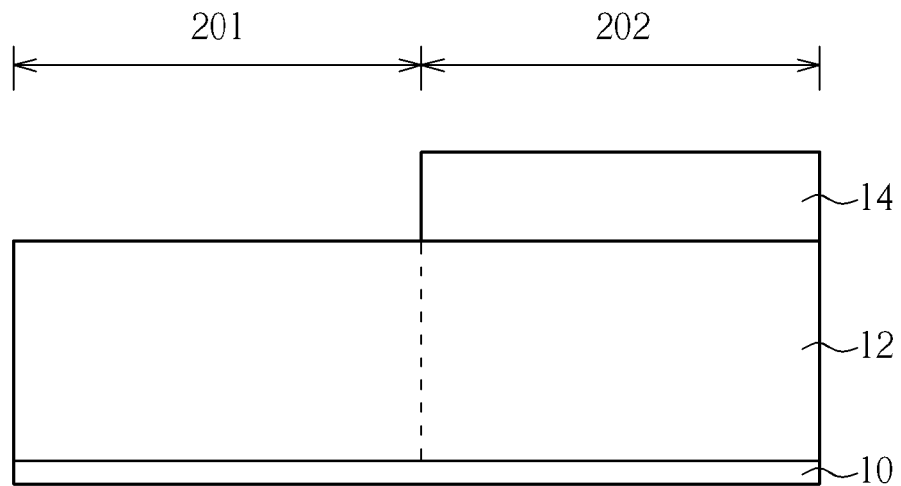
FIGS. 3, 4a, 4b, 5 and 6 are cross-sectional views illustrating an embodiment of the process according the present invention.

One embodiment of the present invention is described in detail hereinafter referring to the flow chart of FIG. 2 and cross-sectional views of FIGS. 3-6. First, in Step 101 and as shown in FIG. 3, a wafer is provided. The wafer may be for example a semiconductor wafer or silicon-on-insulator (SOI) wafer. The wafer is defined into a first region 201, for example a memory cell array region, and a second region 202, for example the peripheral logic region, and includes a first layer 10, for example a nitride layer, and a second layer 12, for example an oxide layer, such as a phosphosilicate glass (PSG) layer. The second layer 12 is vertically on the first layer 10. The second region 202 laterally abuts the first region 201. In a case of fabricating a DRAM device, the peripheral logic region (as the second region) may surround the memory cell array region (as the first region).

Figure 4A:
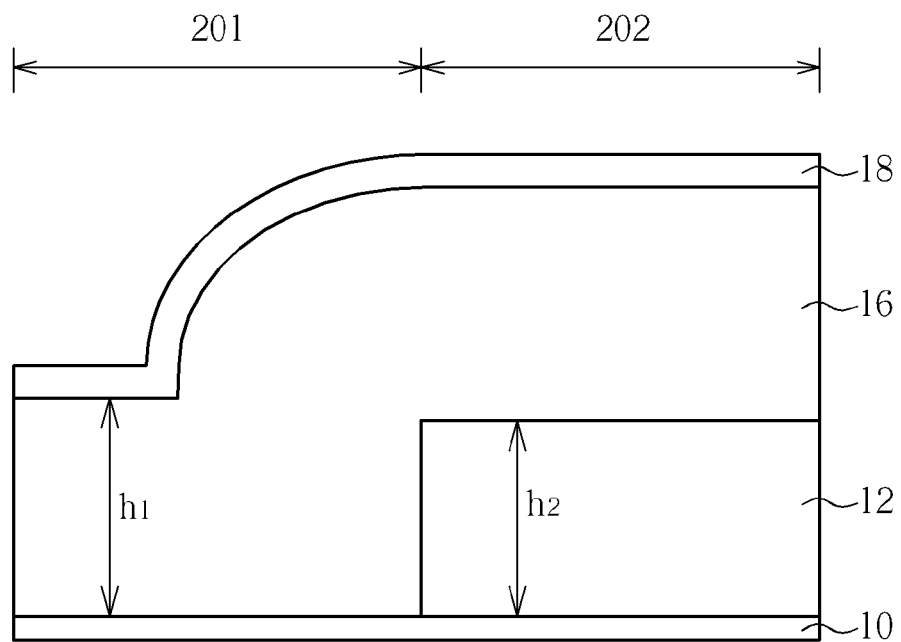

Next, in Step 102, the second layer 12 in the first region 201 (for example the memory cell array region) of the wafer is removed by etch. This may be accomplished by for example forming a mask 14 on the wafer to expose the first region 201 through the opening of the mask 14, and then performing an etching process. Thereafter, the mask 14 is stripped. In Step 103, as shown in FIG. 4a, a third layer 16 is conformally formed for example through a deposition process, to cover the first layer 10 and the second layer 12. The resultant third layer 16 having a height, $h_1$, in the first region 201 may be lower or higher than or at the same level as the second layer 12 having a height, $h_2$, in the second region 202. The third layer 16 may include a material having different etching selectivity relative to the second layer 12. The third layer 16 may be for example a polysilicon layer. In Step 104, a blanket stop layer 18 is conformally formed on the third layer 16. The blanket stop layer 18 may be a layer having a CMP or dry etch selectivity relative to the third layer 16. The blanket stop layer 18 may be for example a nitride or oxide layer.

As shown in the cross-sectional view in FIG. 4a, the second layer 12, the third layer 16 and the blanket stop layer 18 may have, for example, thicknesses of about 13,000 angstroms, 15,000 angstroms, and 800 angstroms, respectively. Accordingly, the top surface of the third layer 16 in the first region 201 is 2000 angstroms higher than the top surface of the second layer 12.

Figure 4B:
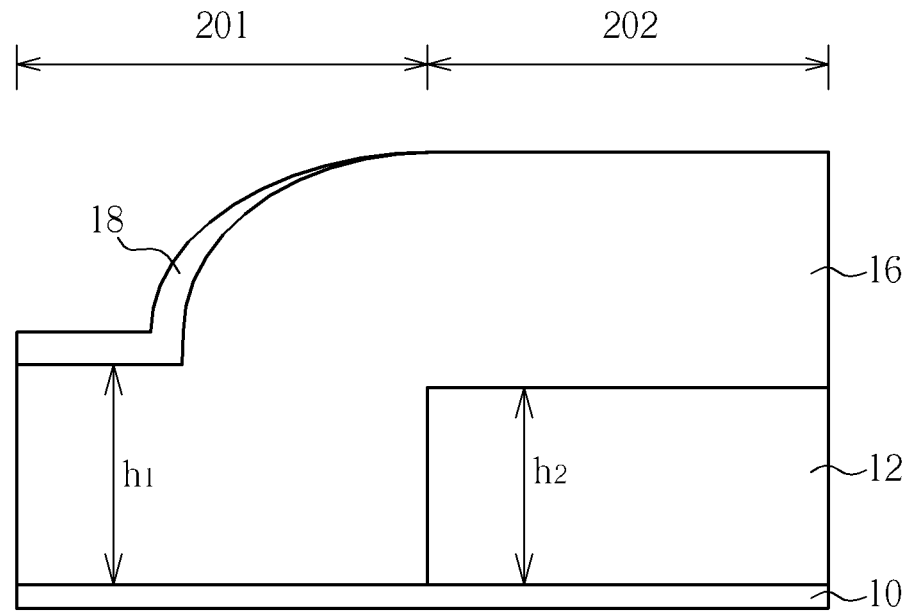

In Step 105, a first CMP process is performed to remove the blanket stop layer 18 atop the third layer 16 in the second region 202 (as shown in FIG. 4b). In the first CMP process, non-selective polishing slurry may be conveniently used, and, during the polishing, a small portion of the top portion of the third layer 16 can also be removed. Alternatively, selective polishing slurry may be used to allow the polishing to stop on the third layer 16. For example, with respect to nitride layer or oxide layer and a polysilicon layer, non-selective polishing slurry may be for example alkaline silica based slurry and polishing slurry selective to the polysilicon layer may be for example ceria based high selective slurry.

Figure 5:
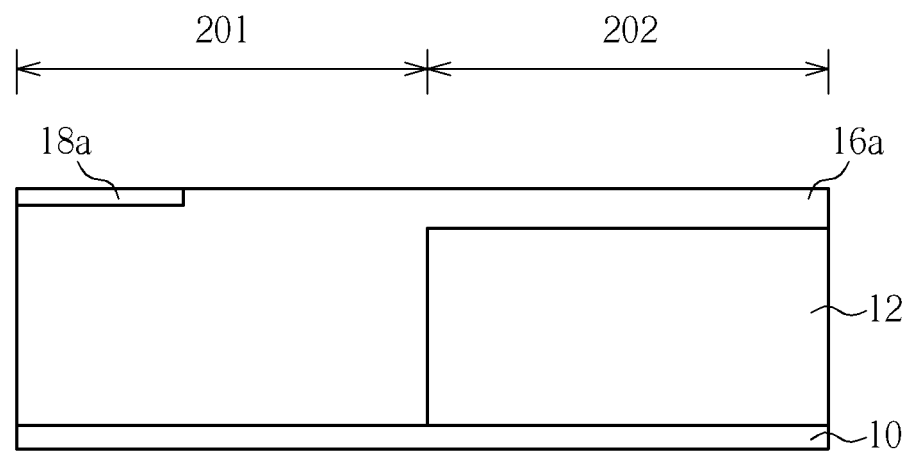

Once the portion of the blanket stop layer 18 atop the third layer 16 is removed, the underlying third layer 16 is exposed, as shown in FIG. 4b. In Step 106, a second CMP or selective dry etch process is performed to planarize the wafer. In the second CMP process, it is preferably to utilize polishing slurry selective to the blanket stop layer 18 or the second layer 12. The blanket stop layer 18 is utilized as a stop layer when the second layer 12 is lower than the blanket stop layer 18, and a result is shown by FIG. 5. A portion 18a of the blanket stop layer 18 remains in the first region 201, and the remaining third layer 16a has a portion (for example in a thickness of 2000 angstroms) remaining on the second layer 12 in the second region 202. For example, with respect to a nitride layer or oxide layer and a polysilicon layer, polishing slurry selective to the nitride layer may be for example silica based alkaline slurry.

The second layer 12 will be utilized as a stop layer in the second CMP process if the blanket stop layer 18 is lower than the second layer 12. Thus, it is preferably to utilize polishing slurry selective to the second layer 12 with respect to the third layer 16, and preferably to the blanket stop layer 18. For example, with respect to a polysilicon layer and an oxide layer, polishing slurry selective to the oxide layer may be for example alkaline silica based slurry.

Figure 6:
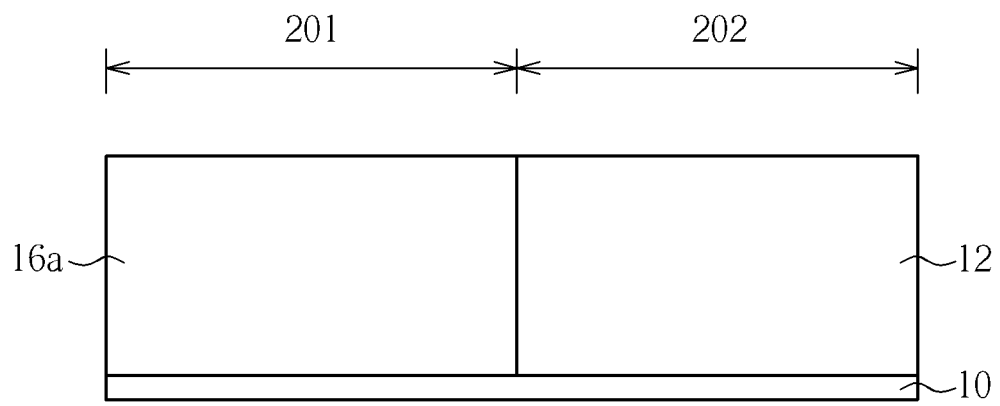

In Step 107, a third CMP process is performed to planarize the wafer to remove the remaining blanket stop layer 18a and the portion of the remaining third layer 16a in the second region 202 to the level of the second layer 12, as shown in FIG. 6. In the third CMP process, it may be convenient to utilize non-selective polishing slurry. Polishing slurry selective to the second layer 12 also can be utilized. For example, with respect to a nitride layer, a polysilicon layer, and an oxide layer, non-selective polishing slurry may be for example alkaline silica based slurry, and polishing slurry selective to the oxide layer may be for example alkali based silica slurry.

In Step 106, the second layer 12 will be utilized as a stop layer for the second CMP process if the blanket stop layer 18 is lower than the second layer 12. In such embodiment, the third layer 16 in the second region 202 is completely removed, and a portion 18a of the blanket stop layer 18 will remain in the first region 201. Thereafter, in Step 107, the third CMP process is performed to planarize the wafer to remove the remaining portion 18a of the blanket stop layer 18 as well as a top portion of the second layer 12. It also results in a profile the same as that shown in FIG. 6. In the third CMP process of this embodiment, it may be still convenient to utilize non-selective polishing slurry.

Furthermore, in Step 107, the remaining blanket stop layer 18a may be stripped using for example selective wet etching or dry etching in advance, and then the third CMP process is performed to planarize the top surface of the entire wafer.

Figure 7:
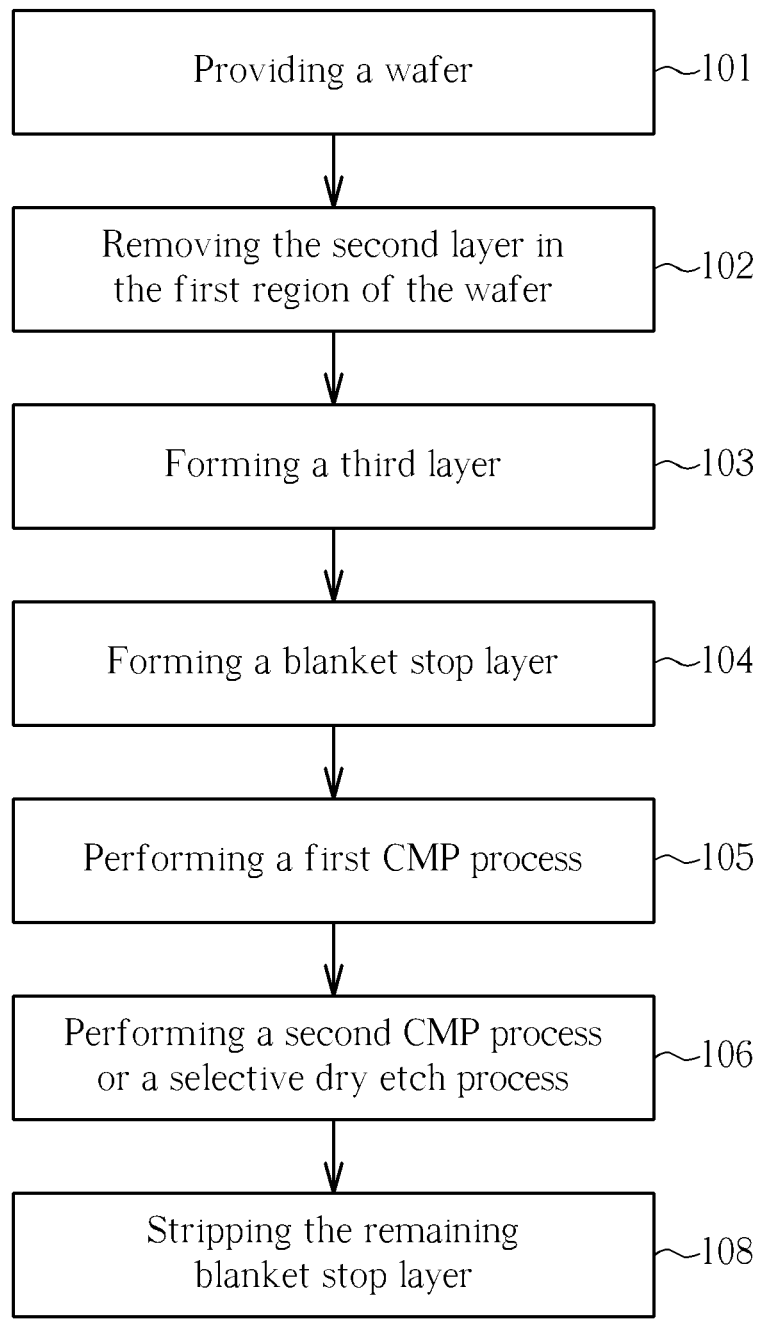
FIG. 7 is a flow chart showing another embodiment according to the present invention.
Figure 8A:
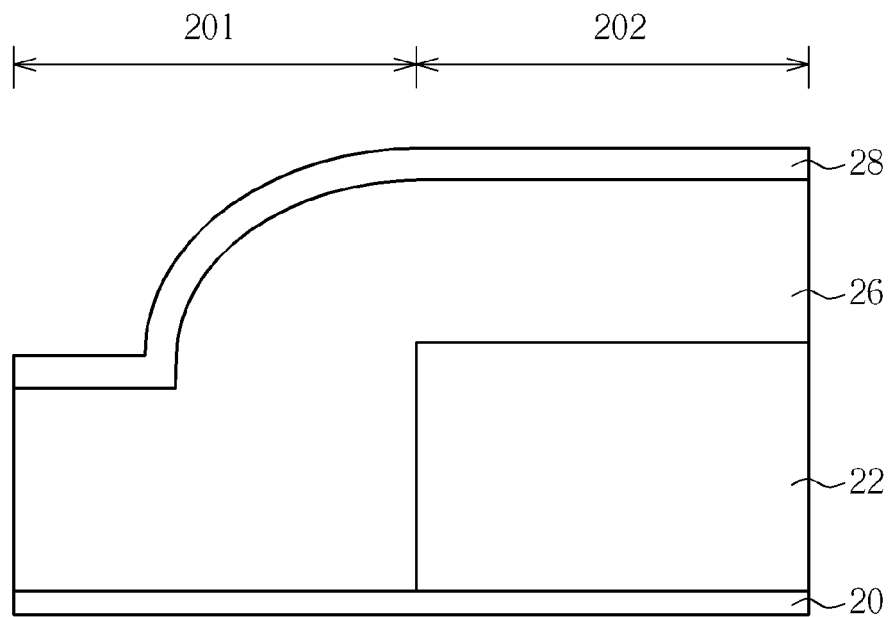
FIGS. 8a, 8b, and 8c are cross-sectional views illustrating another embodiment of the process according to the present invention.

Another embodiment of the present invention is described in detail hereinafter referring to the flow chart of FIG. 7 and cross-sectional views of FIGS. 8a, 8b, and 8c. Step 101 through Step 106 may be the same as those described above as shown in FIG. 2. In this embodiment, the top surface of the blanket stop layer 28 is lower than the top surface of the second layer 22, as illustrated by FIG. 8a, after Step 104 is performed. For example, as shown in the cross-sectional view in FIG. 8a, the second layer 22, the third layer 26 and the blanket stop layer 28 may have thicknesses of about 15,000 angstroms, 13,000 angstroms, and 800 angstroms, respectively.

Figure 8B:
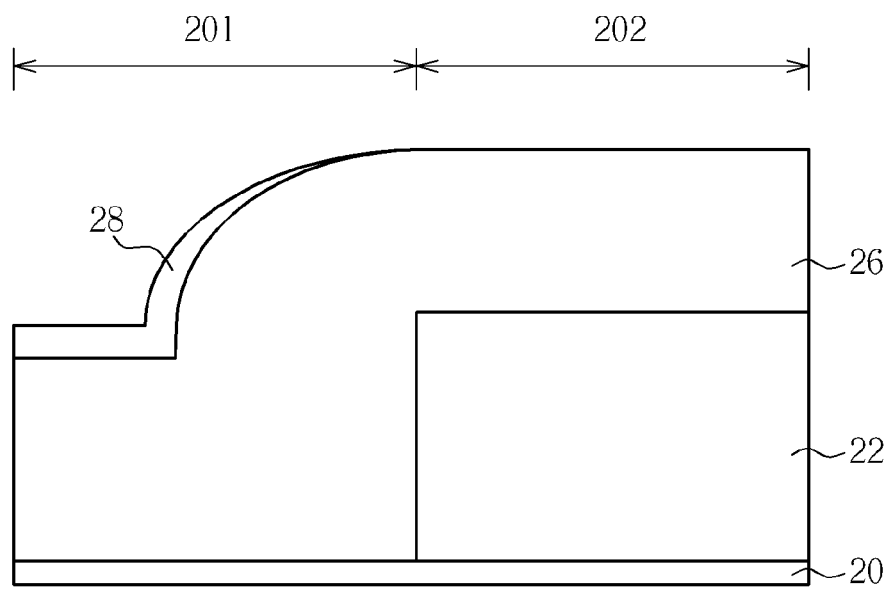
Figure 8C:
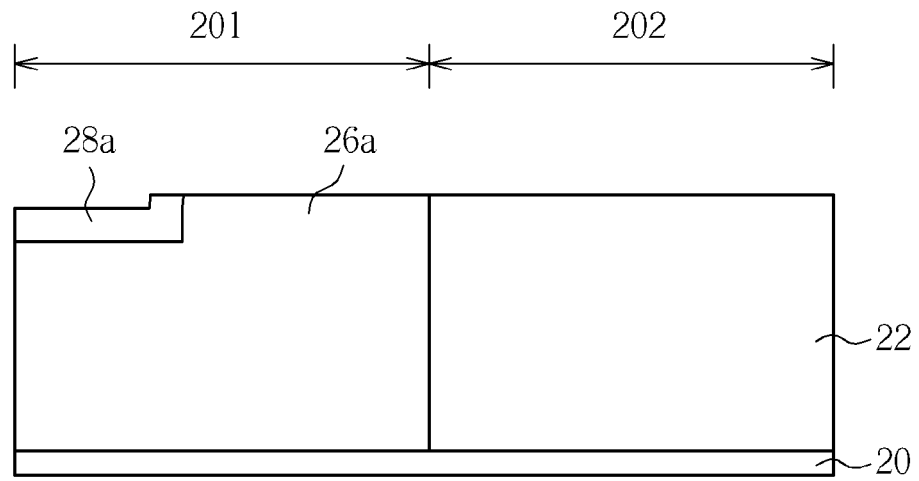

Thereafter, Step 105 is performed the same as described above to remove the blanket stop layer 28 atop the third layer 26 in the second region 202, as shown in FIG. 8b. In Step 106, as the top surface of the blanket stop layer 28 in the first region 201 is lower than the top surface of the second layer 22 in the region 202, the second CMP process is performed using the second layer 22 as a stop layer, as shown in FIG. 8c. The third layer 26 in the second region 202 is completed removed, and a portion 28a of the blanket stop layer 28 remains on the remaining second layer 26a in the first region 201. In Step 108, the remaining blanket stop layer 28, i.e. the portion 28a, is stripped, for example by selective wet etching or dry etching.

In the present invention, the blanket stop layer serves as a sacrificial layer during the second CMP process to polish a wafer having a first region and a second region with a large step height (for example 1.5 to 2.0 µm), accordingly a dishing phenomenon can be prevented. Such method of planarizing a wafer can be suitably utilized to fabricate a DRAM device.

Figure 9:
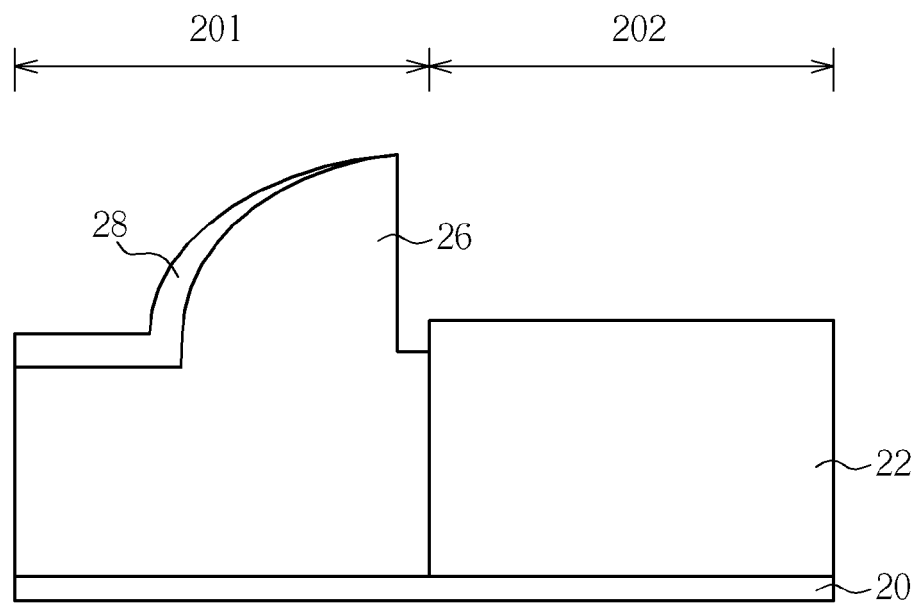
FIG. 9 is a cross-sectional view illustrating further another embodiment of the process according to the present invention.

Alternatively, in Step 106, as shown in FIG. 9, a dry etch process which can etch the third layer 26 selective to the blanket stop layer 28 and the second layer 22 is utilized instead of the CMP process following the first CMP polish. The dry etch process will selectively remove a portion of the third layer 26 not covered by the blanket stop layer 28, leaving the blanket stop layer 28 in the first region 201 and a portion of the third layer 26 below the blanket stop layer 28, which can be later polished and planarized using a non-selective CMP process. The etchant for the dry etch may include, for example, chlorine if the third layer 26 includes silicon or polysilicon.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process of planarizing a wafer, comprising:
    providing the wafer comprising a first layer and a second layer vertically on the first layer and defined into a first region and a second region laterally abutting the first region;
    etching the wafer to remove the second layer in the first region;
    forming a third layer conformally covering the first layer and the second layer;
    forming a blanket stop layer conformally on the third layer;
    performing a first chemical mechanical polishing process to remove the blanket stop layer atop the third layer in the second region;
    performing a selective dry etch process to remove the third layer in the second region selective to the blanket stop layer and the second layer in the second region; and
    performing a second chemical mechanical polishing process to planarize a surface topography of the wafer using a non-selective slurry.

2. The process of planarizing a wafer according to claim 1, wherein the first chemical mechanical polishing process is performed using a non-selective polishing slurry.

* * * * *